United States Patent
Furukawa et al.

(10) Patent No.: US 6,319,759 B1
(45) Date of Patent: Nov. 20, 2001

(54) METHOD FOR MAKING OXIDE

(75) Inventors: Toshiharu Furukawa, Essex Junction; Mark C. Hakey; Steven J. Holmes, both of Milton; David V. Horak, Essex Junction, all of VT (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/131,828

(22) Filed: Aug. 10, 1998

(51) Int. Cl.⁷ .................. H01L 21/00; H01L 21/336; H01L 21/26
(52) U.S. Cl. .................. 438/151; 438/308; 438/298
(58) Field of Search .................. 438/758, 151, 438/770, 771, 776, 787, 981, 795, 308

(56) References Cited

U.S. PATENT DOCUMENTS

| | | | |
|---|---|---|---|
| 4,323,589 | * 4/1982 | Ray et al. | 427/38 |
| 5,407,867 | * 4/1995 | Iwasaki et al. | 437/228 |
| 5,412,246 | * 5/1995 | Dobuzinsky et al. | 257/632 |
| 5,504,030 | 4/1996 | Chung et al. | |
| 5,576,573 | 11/1996 | Su et al. | |
| 5,595,922 | 1/1997 | Tigelaar et al. | |
| 5,597,753 | 1/1997 | Sheu et al. | |
| 5,605,846 | 2/1997 | Ohtani et al. | |
| 5,885,904 | * 3/1999 | Mehta et al. | 438/758 |
| 5,897,327 | * 4/1999 | Asano et al. | 438/17 |
| 5,904,575 | * 5/1999 | Ishida et al. | 438/770 |

FOREIGN PATENT DOCUMENTS

49096300 * 8/1993 (JP) .

OTHER PUBLICATIONS

Weiner et al., "Ultrashallow Junction Formation Using Protection Gas Immersion Laser Doping (PGILD)," A Verdant Technologies Technical Brief, pp. 1–6, Aug. 1997.

* cited by examiner

Primary Examiner—Michael Lebentritt
(74) Attorney, Agent, or Firm—Schmeiser, Olsen & Watts; William D. Sabo

(57) ABSTRACT

A method of forming oxide and gate oxide areas of differing thicknesses. The processes disclosed include using an electromagnetic wave light at differing exposure durations and/or different energy levels to create oxide of differing thicknesses on a layer. The electromagnetic wave is preferably a laser.

28 Claims, 2 Drawing Sheets

METHOD FOR MAKING OXIDE

BACKGROUND OF THE INVENTION

1. Technical Field

The present invention relates generally to semiconductor manufacturing and, more particularly, to a method of making oxide and multiple thickness oxide with masked laser oxidation.

2. Related Art

Heretofore, many high performance chips have required more than one gate oxide thickness for MOSFET devices on a chip to optimize the internal circuits which operate at lower voltages and input/output (I/O) circuits which operate at high voltages. Further, the competition for improved circuit performance has driven the device channel scaling down to 0.18 um or shorter to obtain higher current drive from CMOS devices. Gate oxide has been scaled below 5 nm to keep a strong gate control of the device to minimize the short channel effects. The devices operate at 2.5 volt or below in order to maintain the high reliability. Since many other components on the board or in the system still operate at 3.3V or 5V, the input/output circuits of the chip must receive and drive 3.3V or 5V signals. As a result, oxide in these circuits are stressed at higher electrical fields than in the internal logic circuit during product operation, thus degrading chip reliability.

Prior to the present invention, the provision of gate silicon oxide in differing thicknesses has been generally provided through multiple oxidation processes with etching of the first oxide followed by a growth of a thinner oxide layer with a photoresist over the oxide area where thicker oxide is formed. Another process provides a single oxidation process with partial etching of oxide to make thinner oxide with a photoresist on the oxide where thicker oxide is desired. Unfortunately, photoresist processes and the subsequent cleaning processes have been known as a major source of oxide defects in the prior art. A further disadvantage of the prior art method is the complexity of the process in requiring a photolithography and etch.

Another disadvantage of the prior art method is that either a furnace oxidation or rapid thermal oxidation heats up a whole wafer, thus the doping, particularly the channel tailor doping of the high performance device with thinner gate oxide, is moved significantly during the multiple oxidation steps, resulting in the poor device parametric controls and performance degradation.

From above, there is a need for a new method of creating different thickness gate oxide to provide for the differing voltages used within a chip.

SUMMARY OF THE INVENTION

The present invention provides a method to overcome the above-identified problems of the related art through the use of, in general, masked laser oxidation to create gate oxide and/or gate oxide of multiple thicknesses on a chip.

In a first general aspect of the present invention is provided a method of forming oxide comprising the steps of providing a layer; and exposing a first area of the layer upon which oxide is to be grown to an electromagnetic wave during a first exposure. This aspect allows for the creation of oxide without the need for photoresist that contacts the layer. Further, it provides a oxide growth method where heat is localized such that it may be dissipated through the wafer.

In a second general aspect in accordance with the present invention is provided a method of forming oxide, comprising the steps of providing a layer, exposing a first area of the layer upon which oxide is to be grown to a first thickness to an electromagnetic wave and exposing at least one other area of the layer upon which oxide is to be grown to a differing thickness than the first area to an electromagnetic wave. This aspect provides similar advantages so that of the first aspect and further allows for the creation of oxide of differing thicknesses.

In a third general aspect in accordance with the present invention is provided a method of forming oxide comprising the steps of: providing a layer, exposing a first area of the layer upon which oxide is to be grown to an electromagnetic wave having a first power and first duration to form oxide of a first thickness, and exposing at least one other area of the layer upon which oxide is to be grown to an electromagnetic wave having at least one of a differing power and differing duration to form oxide of a differing thickness. This aspect provides similar advantages as the second aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiments.

Figure 1:
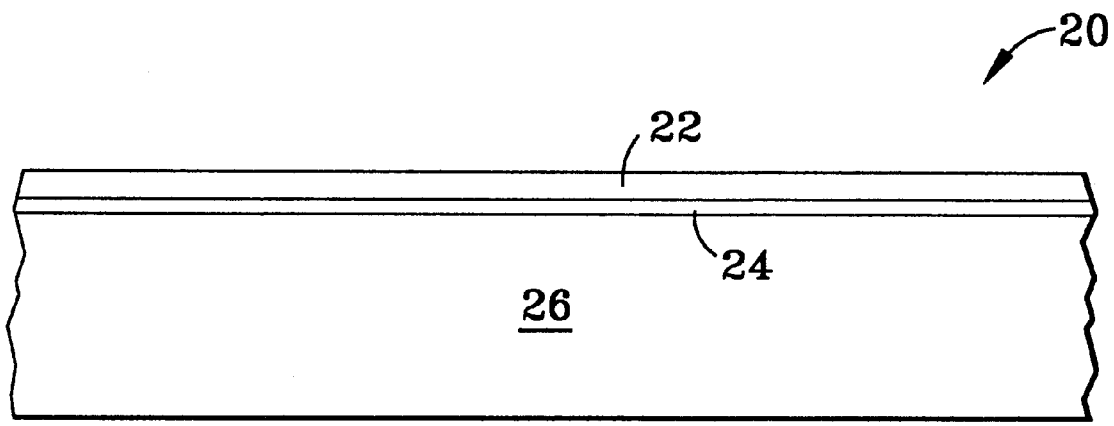
FIG. 1 shows a silicon layer after preliminary preparation for the method in accordance with the present invention.

Referring to FIG. 1, a silicon wafer 20 having applied thereto preliminary processes in preparation to the method in accordance with the present invention is shown. In particular, the standard p-type or n-type silicon layer or substrate 26 with a layer of pad oxide 24 and pad nitride 22 layered thereupon is shown. The pad oxide 24 is approximately 5 nm to 10 nm thick while the pad nitride is 70 nm to 100 nm thick. It is important to note, however, that the layer 26 need not be silicon as the present invention can be applied to a variety of materials, e.g., silicon, silicon germanium ($Si_{1-x}Ge_x$), germanium (Ge), silicon on insulator (SOI), etc.

Figure 2:
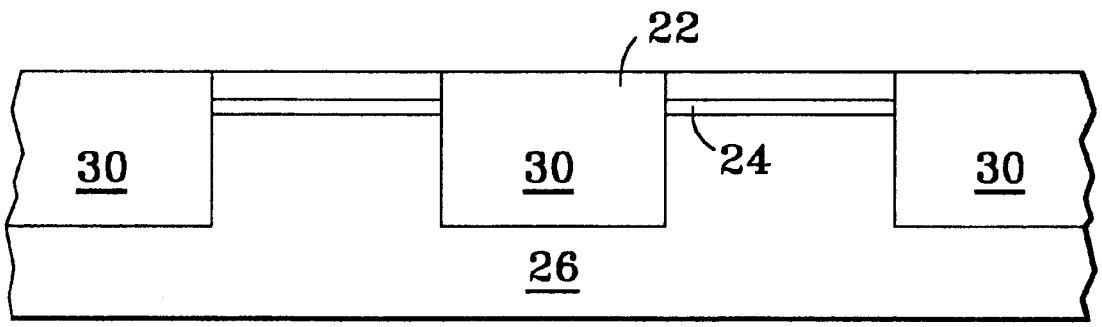
FIG. 2 shows further preliminary processes to the method in accordance with the present invention.

FIG. 2 shows a second preliminary process in preparation for processes in accordance with the present invention. At this time, shallow trench isolation areas (STI) 30 are provided. The STI areas 30 are formed by photolithography and etch processes followed by trench sidewall oxidation, deposition of fill oxide, and planarization by chemical/ mechanical polishing (CMP). The STI areas 30 are preferably 0.2 um to 0.4 um deep while the trench sidewall oxidation is preferably 1 nm to 4 nm in thickness.

Next, the pad nitride and pad oxide are stripped. This is followed by a thermal oxidation of the exposed silicon layer 26 to form sacrificial oxide in the range of 3 nm to 6 nm in thickness. Well and gate tailor implantations for both p-type and n-type devices follow this step, i.e., the doping concentrations under the Field Effect Transistor (FET) are adjusted to set a desirable threshold voltage. Prior to growth of gate oxide in accordance with the present invention, the sacrificial oxide is stripped.

It should be noted, that the above-described steps are in preparation for the processes in accordance with the present invention and, accordingly, are not an integral part of the present invention. That is, while specific preparatory processes have been described, other methods and steps are possible. Further, the present invention is not limited in application to a semiconductor device. For instance, the present invention may be applied to a charged-couple device (CCD), thin film transistor (TFT), a field effect transistor on polysilicon film, capacitors, or any material upon which oxide is to be provided.

Figure 3:
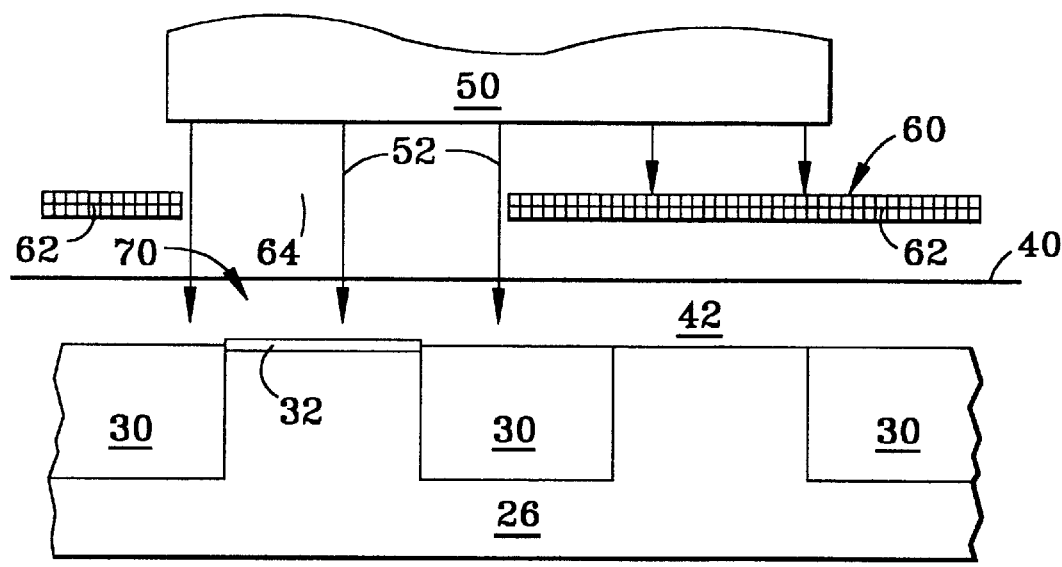
FIG. 3 shows growth of a gate oxide in accordance with the present invention.
Figure 4:
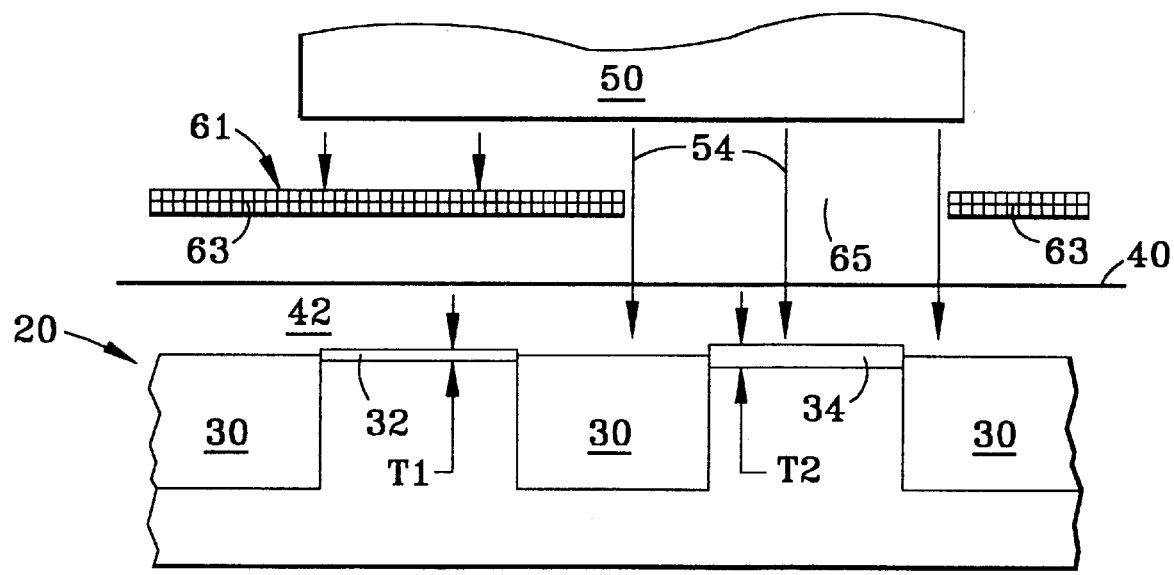
FIG. 4 shows growth of gate oxide differing in thickness than that of FIG. 3 in accordance with the present invention.

FIGS. 3 and 4 show the process of growing oxide in accordance with the present invention. In order to grow oxide and/or oxide of differing thicknesses, as shown in FIG. 3, the layer 26 including the shallow trench isolations 30 are enclosed in a chamber 40 of gaseous oxidant 42. The gaseous oxidant 42 may take the form of any gas which will provide the necessary oxidation, for example, oxygen ($O_2$), steam ($H_2O$), ozone ($O_3$), oxygen plasma, or nitrous oxide ($N_2O$). Preferably, the gaseous oxidant 42 is oxygen. The gaseous oxidant 42 in the chamber 40 may also be pressurized in the range of 0.1 to 10 atmospheres but is preferably at one atmosphere.

In order to grow the oxide or gate oxide 32, as shown in FIG. 3, an electromagnetic wave or an electromagnetic light source 50 is provided. The electromagnetic wave or light source 50 emits a wave or light 52 which is patterned by a mask 60 over a first area 70 upon which a first oxide 32 of a first thickness is to be grown. The mask 60 blocks the wave or light 52 from the other exposed layer surfaces where oxide of other thicknesses is to be grown, as will be discussed later. While the electromagnetic light source 50 is shown exterior to chamber 40, it may also be located within chamber 40, if desired.

The mask 60 is preferably a dielectric mask 62 made of, for instance, interference silicon dioxide ($SiO_2$) quartz or a metal such as aluminum or stainless steel. It should be noted, however, that any material capable of preventing passage of the wave or light 52 is a possible alternative. It is an advantage of the present invention that the mask 60 is elevated and not in contact with the surface of the layer 26 in contrast to a photoresist which would contact the layer 26. The mask 62 is supported by a holder (not shown) above chamber 40.

In terms of the type of electromagnetic wave or light source 50 used, a zenon chloride (XeCl) excimer laser light has been found to be preferable. The wavelength of the light is preferably approximately 308 nm. In terms of the duration and energy of the light, it has been found desirable to have the energy be between 1 $mJ/cm^2$ and 100 $mJ/cm^2$. The duration of time to which the layer 26 is exposed may range between 3 milliseconds to 10 minutes. The energy of the wave or light source and the duration of time to which the layer 26 is exposed determines the thickness of the oxide 32 which is created.

It is a further advantage of the present invention that oxide of different thicknesses may be created by repeating the above processes over different areas of the layer 26. In particular, as shown in FIG. 4, the mask 60 may be moved or replaced by another mask 61 to expose the layer 26 over a second area 72 which is to have grown thereupon an oxide 34 of a second and different thickness compared to the oxide 32 of FIG. 3. During this step, the first area 70 and first oxide 32 is blocked by the mask 61 and its subparts 63. In order for the electromagnetic wave or light source 50 to create the oxide 34 of a different thickness than that of first oxide 32, the energy of the wave/light source 50 and/or the duration of time of the exposure of the wave/light source 54 to the second area 72 is changed, i.e., increased or decreased in order to grow oxide of greater or lesser thickness, respectively.

As shown in FIG. 4, the above processes allow for the creation of gate oxide of differing thicknesses T1 and T2 across a silicon layer 26. It is a further advantage of the present invention in that the above processes may be repeated as desired by a user to create any number of gate oxide areas with differing thicknesses on a single silicon layer 26. Another advantage is the removal of a conventional oxidation process step such that heat applied to the wafer 20 may be localized and, therefore, dissipated through the wafer 20. Once the gate oxide areas have been created to the satisfaction of the user, the wafer 20 may proceed through finishing steps as desired. For instance, the wafer 20 may be annealed in nitrogen ($N_2$) with a 2 percent oxygen ($O_2$) ambient at about 800° C.–900° C. for approximately 15 minutes to reduce the interface states at gate oxide and the substrate interfaces.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

In particular, the wave/light source used in accordance with the present invention may be any electromagnetic wave having a wavelength of infrared, visible, UV, deep UV or x-ray. The wavelength could also vary. Further, as an alternative, after the thicker gate oxidation by the masked laser anneal described above, the thinner gate oxide can be grown by conventional furnace or rapid thermal oxidation rather than by the described method. Conversely, the thicker gate oxidation may be grown using conventional techniques while the thinner gate oxide is grown in accordance with the present invention.

The layer upon which oxide is grown also does not necessarily have to be a silicon substrate. For instance, the instant invention may find application with a substrate or a film. Further, the layer may be made of any material upon which oxide is desired, e.g., silicon, silicon germanium ($Si_{1-x}Ge_x$), germanium (Ge), silicon on insulator (SOI), etc. Last, the type of device to which the present invention is applied need not be a MOSFET device on a single crystal silicon substrate, it may be, for instance, a charged-couple device (CCD), thin film transistor (TFT), a field effect transistor on polysilicon film, capacitors, or any device upon which oxide is desired.

We claim:

1. A method of forming oxide, comprising the steps of:
   providing a layer;

exposing a first area of the layer upon which oxide is to be grown to an electromagnetic wave and during a first exposure to form a first layer of oxide having a first thickness, wherein the electromagnetic wave has a first given power and is exposed to the first area for a first exposure duration; and exposing a second area of the layer upon which oxide is to be grown to an electromagnetic wave during a second exposure to form a second layer of oxide having a second thickness.

2. The method of claim 1, further comprising: providing a first mask to pattern the electromagnetic wave during the first exposure and a second mask to pattern the electromagnetic wave during the second exposure.

3. The method of claim 1, wherein the electromagnetic wave exposed to the second area has at least one of a second given power and second exposure duration.

4. The method of claim 1, further comprising enclosing the substrate in a gaseous oxidant.

5. The method of claim 4, wherein the gaseous oxidant is selected from the group consisting of: oxygen, steam, nitrous oxide, plasma oxygen and ozone.

6. The method of claim 1, further comprising providing a mask to pattern the electromagnetic wave.

7. The method of claim 6, wherein the mask is in non-contact with the layer.

8. The method of claim 6, wherein the mask is selected from the group consisting of: interference silicon dioxide quartz, aluminum and stainless steel.

9. The method of claim 1, wherein the electromagnetic wave is a laser.

10. The method of claim 9, wherein the laser is an XeCl excimer laser having a wavelength of approximately 308 nm.

11. The method of claim 3, wherein the first and second exposure duration range between 3 milliseconds and 10 minutes.

12. The method of claim 3, wherein the first and second power range between 1 mj/cm$^2$ and 100 mJ/cm$^2$.

13. The method of claim 1, wherein the layer is selected from the group consisting of: silicon, silicon germanium, germanium and silicon on insulator.

14. A method of forming oxide, comprising the steps of:

providing a layer;

exposing a first area of the layer upon which oxide is to be grown to an electromagnetic wave to form a first layer of oxide having a first thickness; and exposing at least one other area of the layer upon which oxide is to be grown to an electromagnetic wave to form a second layer of oxide having a differing thickness than the first layer of oxide.

15. The method of claim 14, wherein the first area is exposed for a first predetermined time and the second area is exposed for a second predetermined time.

16. The method of claim 15, wherein the first and second predetermined time range between 3 milliseconds to 10 minutes.

17. The method of claim 14, wherein the first area is exposed to an electromagnetic wave of a first power and the second area is exposed to one of an electromagnetic wave of a second power.

18. The method of claim 17, wherein the first and second power range between 1 mJ/cm$^2$ and 100 mj/cm$^2$.

19. The method of claim 14, wherein the first area is exposed to an electromagnetic wave for one of a first predetermined time and a first predetermined power and the second area is exposed for at least one of a second predetermined time and a second predetermined power.

20. The method of claim 14, further comprising enclosing the layer in a gaseous oxidant.

21. The method of claim 20, wherein the gaseous oxidant is selected from the group consisting of: oxygen, steam, nitrous oxide, plasma oxygen, and ozone.

22. The method of claim 14, further comprising providing a mask to pattern the electromagnetic wave.

23. The method of claim 22, wherein the mask is in non-contact with the layer.

24. The method of claim 22, wherein the mask is selected from the group consisting of: interference silicon dioxide quartz, aluminum and stainless steel.

25. The method of claim 14, wherein the electromagnetic wave is a laser.

26. The method of claim 25, wherein the laser is an XeCl excimer laser having a wavelength of approximately 308 nm.

27. The method of claim 14, wherein the layer is selected from the group comprising of: silicon, silicon germanium, germanium and silicon on insulator.

28. A method of forming oxide comprising the steps of:

providing a layer;

exposing a first area of the layer upon which oxide is to be grown to an electromagnetic wave having a first power and first duration to form oxide of a first thickness; and exposing at least one other area of the layer upon which oxide is to be grown to an electromagnetic wave having at least one of a differing power and differing duration to form oxide having a thickness different than the first thickness.

* * * * *

UNITED STATES PATENT AND TRADEMARK OFFICE
CERTIFICATE OF CORRECTION

PATENT NO. : 6,319,759 B1
DATED : November 20, 2001
INVENTOR(S) : Furukawa et al.

It is certified that error appears in the above-identified patent and that said Letters Patent is hereby corrected as shown below:

Column 5,
Line 39, delete lowercase "j" and insert uppercase -- J --.

Column 6,
Line 12, delete lowercase "j" and insert uppercase -- J --.

Signed and Sealed this

Thirtieth Day of April, 2002

Attest:

JAMES E. ROGAN
Attesting Officer    Director of the United States Patent and Trademark Office